(12) United States Patent
Seifert et al.

(10) Patent No.: US 9,117,771 B2
(45) Date of Patent: Aug. 25, 2015

(54) INSULATION MATERIAL FOR INTEGRATED CIRCUITS AND USE OF SAID INTEGRATED CIRCUITS

(75) Inventors: Gotthart Seifert, Dresden (DE);
Helmut Hermann, Dresden (DE);
Konstyantyn Zagorodniy, Cologne (DE); Ehrenfried Zschech, Moritzburg (DE)

(73) Assignees: LEIBNIZ-INSTITUT FUER FESTKOERPER-UND WERKSTOFFFORSCHUNG DRESDEN E.V., Dresden (DE);
GLOBALFOUNDRIES INC., Cayman Islands (KY)

( * ) Notice: Subject to any disclaimer, the term of this patent is extended or adjusted under 35 U.S.C. 154(b) by 878 days.

(21) Appl. No.: 13/202,228

(22) PCT Filed: Feb. 3, 2010

(86) PCT No.: PCT/EP2010/051297
§ 371 (c)(1),
(2), (4) Date: Aug. 18, 2011

(87) PCT Pub. No.: WO2010/094562
PCT Pub. Date: Aug. 26, 2010

(65) Prior Publication Data
US 2011/0297869 A1    Dec. 8, 2011

(30) Foreign Application Priority Data
Feb. 20, 2009   (DE) .......................... 10 2009 001 044

(51) Int. Cl.
*E04B 1/74*  (2006.01)
*H01L 21/312*  (2006.01)

(52) U.S. Cl.
CPC ................................... *H01L 21/312* (2013.01)

(58) Field of Classification Search
CPC .... B01J 20/226; B01J 31/1691; B01J 20/024;
B01J 20/0237; B01J 20/0244; C07F 5/06;
C07F 5/08; H01L 21/32; H01L 21/3105;
H01L 21/02107
USPC ........ 252/62; 257/40; 540/465; 556/110, 118
See application file for complete search history.

(56) References Cited

U.S. PATENT DOCUMENTS

2004/0097724 A1 *   5/2004   Muller et al. ................. 540/465

FOREIGN PATENT DOCUMENTS

| DE | 102 53 855.7 | 6/2004 |
| EP | 1 420 447 | 5/2004 |

OTHER PUBLICATIONS

M. Eizenberg, "Introduction: interlayer dielectrics in microelectronic devices," Interlayer Dielectrics for Semiconductor Technologies, Elsevier Acadamie Press, Amsterdam, 2003, Chapter 1, pp. 1-6.
(Continued)

*Primary Examiner* — Khanh Tuan Nguyen
(74) *Attorney, Agent, or Firm* — Greenblum & Bernstein, P.L.C.

(57) ABSTRACT

The invention relates to the fields of microelectronics and materials sciences and concerns an insulation layer material for integrated circuits in microelectronics, which can be used, for example, in integrated circuits as insulation material in semiconductor components. The object of the present invention is to disclose an insulation material for integrated circuits, which has dielectric constants of $k \leq 2$ with good mechanical properties at the same time. The object is attained with an insulation material for integrated circuits, containing at least MOFs and/or COFs.

16 Claims, 1 Drawing Sheet

(56) References Cited

OTHER PUBLICATIONS

J-Y. Zhang et al., "Low dielectric constant porous silica films formed by photo-induced sol-gel processing", Materials Science in Semiconductor Processing, vol. 3, Issues 5-6, Oct. 2000, pp. 345-349.

C. Murray et al., "Comparison of techniquest to characterise the density, porosity, and elastic modulus of porous low-k SiO2 xerogel films", Microelectronic Engineering, vol. 60, 2002, pp. 133-141.

J. Wang et al., "Thickness dependence of elastic modulus and hardness of on-wafer low-k ultra thin polytetrafluoroethylene films", Scripta Materialia, vol. 42, 2000, pp. 687-694.

O.M. Yaghi et al., "Reticular synthesis and the design of new materials", Nature, vol. 423, 2003, pp. 705-714.

A.P. Cote et al., "Porous, crystalline, covalent organic framworks ", Science, AAAS, vol. 310, Nov. 18, 2005, pp. 1166-1170.

H. Li, "Design and synthesis of an exceptionally stable and highly porous metal-organic framework", Nature, vol. 402, Nov. 1999, pp. 276-279.

A. Kuc et al., "Metal-organic framworks: structural, energetic, electric and mechanical properties", Journal of Physical Chemistry B, American Chemical Society, vol. 111, No. 28, Jul. 2007, pp. 8179-8186.

M.E. Davis, "Ordered Porous Meterials for Emerging Applications", Nature, Nature Publishing Group, London, GB, vol. 417, Jun. 20, 2002, pp. 813-821.

C.M. Garner et al., "Challenges for dielectric materials in future integrated circut technologies", Microelectronics Reliability, Elsevier Science Ltd, vol. 45, No. 5-6, May 1, 2005, pp. 919-924.

R.D. Miller, "In Search of Low-k Dielectrics", Sciene, 1999, vol. 286, No. 5439, pp. 421-423.

H. Kajiro, "Flexible Two-Dimensional Square-grid Coordination Polymers: Structures and Functions", Int. J. Mol. Sci., 2010, vol. 11, pp. 3803-3845.

Data Sheet of BASF/Sigma-Aldrich "Basolite A100", Product No. 688738.

Data Sheet of BASF/Sigma-Aldrich "Basolite C300", Product No. 688614.

* cited by examiner

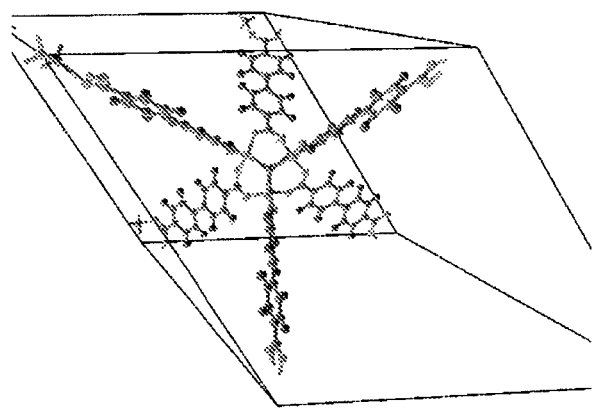

INSULATION MATERIAL FOR INTEGRATED CIRCUITS AND USE OF SAID INTEGRATED CIRCUITS

The invention relates to the fields of microelectronics and materials sciences and concerns an insulation layer material for integrated circuits in microelectronics, which can be used, for example, in integrated circuits as an insulation material in semiconductor components.

The development and optimization of insulation materials with very good dielectric properties (dielectric constant k<3 if possible) is currently one of the most urgent tasks in microelectronics. This is above all because in this field there is a backlog of several years compared to the "roadmap" of the international semiconductor industry (M. Eizenberg, Interlayer Dielectrics for Semiconductor Technologies, Elsevier Acadamie Press, Amsterdam 2003, p. 5; R. D. Miller, Science 286 (1999) 421-422).

According to this "roadmap," a need has existed for years for insulation materials which have a static dielectric constant k<2 and in particular k<1.6, at the same time having an energy gap of ≥3 eV and a mechanical compressive modulus B of ≥6 GPa.

However, an insulation material of this type is not yet known.

The use of homogenous $SiO_2$ as a dielectric in microelectronics is known (Miller, R. D., Science 286 (1999) 421-422). $SiO_2$ can be applied, inter alia, by plasma-enhanced chemical vapor deposition (PECVD). Dielectrics of this type achieve values for the dielectric constant of k=3.9 to 4.2. With increasing package density and increasing power per chip, the dielectric $SiO_2$ can no longer be used in future due to the high k value.

Furthermore, porous $SiO_2$ materials are known as dielectrics (Zhang, J.-Y. et al., Mater. Sci. in Semiconductor Processing 3 (2000) 345-349; Murray, C. et al., Microelectronic Engng. 60 (2002) 133-141), these materials currently being still in the test phase for use. These materials can be applied, inter alia, by catalytic sol-gel polymerization of orthosilicate esters. The solvent is removed from the gel layer by supercritical extraction (aerogels) or eliminated by solvent exchange and drying (xerogels). Dielectrics of this type achieve values for the dielectric constant of k=1.7 to 3.6.

The disadvantages of these dielectrics are the very high production expenditure. The degrees of porosity at 50 to 80% are very high and unfavorably, the pores are open and to a great extent connected to one another. Furthermore, the pore size distribution cannot be controlled sufficiently well. Pores and channels of pores connected to one another can form, which lead to the electrical connection of adjacent metal conductors that should be separated by the dielectric. This can lead to the failure of the chip.

The use of homogenous polymers as dielectrics is also known. However, only the highly fluorinated alkane derivatives achieve k values of <2.2, such as PTFE, for example, with k values of 1.9 to 2.1 (Wang, J. et al., Scripta mater. 42 (2000) 687-694). PTFE layers can be produced from surfactant-stabilized aqueous microemulsions.

Furthermore, according to DE 102 53 855.7 A1 an insulation layer material for integrated circuits in damascene architecture is known, which are composed of fullerenes arranged separated from one another by molecules or groups of molecules. The molecules or groups of molecules are thereby connected to the fullerenes at least at two points via chemical and/or physical interactions. This insulation layer material has k values of <4.0 with an adjustable pore size of <2.0 nm.

The known insulation materials for integrated circuits are produced either by CVD or spin-on processes.

All of the known solutions have in common that their mechanical strength deteriorates significantly with lower k values.

Furthermore, metallo-organic frameworks (MOFs) (O. M. Yaghi, et al., Nature 423, 705 (2003)) and covalent frameworks (COFs) (A. P. Côté, et al., Science 310, 1166 (2005)) are known. These materials are coordination polymer compounds, which are linked to form a regular three-dimensional network. The prototype of the metallo-organic framework is MOF-5, in which $Zn_4O$ structural units are linked via terephthalate bridges to form a zeolite-like cubic three-dimensional network (H. Li, et al., Nature 402, 276, (1999)).

The special advantage of these MOFs and COFs is their extremely large specific surface, because of which they have previously been used to adsorb and store gases and as sensors.

The known properties and applications of MOFs (www.mdpi.org/ijms/specialissues/frameworks) and COFs (A.P. Câté, et al., Science 2005, 310, 1166-1170) are based on their enormously high specific surface of in some cases several 1000 $m^2$/g. Some MOFs have already been commercially produced and characterized in corresponding data sheets, for example, given in data sheets of BASF/Sigma-Aldrich (www.Sigmaaldrich.com/Produkte, product numbers 688738, 688614).

No information on or indications of particularly low dielectric constants of MOFs and COFs are known from the prior art.

The object of the present invention is to disclose an insulation material for integrated circuits, which has dielectric constants of k≤2 with good mechanical properties at the same time.

The object is attained through the invention disclosed in the claims. Advantageous embodiments are the subject matter of the subordinate claims.

The insulation material according to the invention for integrated circuits contains at least MOFs and/or COFs.

Advantageously, exclusively MOFs form the insulation material.

Furthermore advantageously, the insulation material is composed of MOFs and/or COFs and adhesives, such as parylene.

Likewise advantageously, MOFs are present within a network in crystalline to random, free form.

And also advantageously, MOFs are present with an isoreticular cubic network with analogous structural principle (IR-MOFs), these being still more advantageously IRMOF-1 FCC, IRMOF-1 SC, IRMOF-10, IRMOF-M11, IRMOF-M13, IRMOF-14.

It is also advantageous if a metal atom is present as the central atom in the network, still more advantageously Cu or Zn being present as a metal atom.

In the use according to the invention, MOFs and/or COFs are used as insulator material with dielectric constants of k≤2 for integrated circuits.

Advantageously, exclusively MOFs are used as insulator material with dielectric constants of k≤2 for integrated circuits.

Furthermore advantageously, MOFs and/or COFs are used as insulator material with dielectric constants of k≤2 for integrated circuits and adhesives, still more advantageously parylene being used as an adhesive.

Likewise advantageously, MOFs with a network in crystalline to random, free form are used as insulator material with dielectric constants of k≤2 for integrated circuits.

It is also advantageous if MOFs with an isoreticular cubic network with analogous structural principle (IRMOFs) are used as insulator material with dielectric constants of k≤2 for integrated circuits.

And it is also advantageous if MOFs or COFs with a central metal atom in the network are used as insulator material with dielectric constants of k≤2 for integrated circuits, still more advantageously Cu or Zn being used as metal atom for insulator material with dielectric constants of k≤2 for integrated circuits.

With the solution according to the invention, MOFs and COFs are employed and used as insulation material or in insulation materials for the first time.

The particularly low dielectric constants and their combinations have not been hitherto known with sufficiently good mechanical properties of the MOFs and COFs.

It has been established according to the invention that the MOFs and COFs, despite the presence of metal atoms, have very good to excellent insulating properties with particularly low static dielectric constants and at the same time still largely very good to excellent mechanical properties.

Depending on the special requirement, the aspect of the low dielectric constants or the aspect of the high compressive modulus can be emphasized in the selection of the MOFs or COFs to be used. In addition, the width of the energy band gap of the insulation material can also be varied with the selection of the MOFs or COFs.

Another advantage of the solution according to the invention is that the insulation material has a structural homogeneity with monodisperse pore sizes which is a further advantage compared to porous materials with finite width of the pore size distribution, which has an effect on product reliability in particular.

Likewise the signal delay can be improved with the solution according to the invention, which hitherto occurred as a limiting factor in integrated circuits. The reason for the signal delay is the product RC, that is, resistance times capacitance. The capacitance of the insulation material can be reduced by the use of porous to cellular materials. However, the mechanical strength must then be taken into account for the technological processes, which decreases with increasing porous or cellular content.

For the solution according to the invention the number, type, structure, size and/or length of the MOFs or COFs in the entire known bandwidth can thereby be applied and used.

However, it should be taken into account in the selection of the concrete materials that in each individual case the properties from the coordinates of the atoms in the elementary cell have to be newly determined.

Furthermore, it must be taken into account that the lower the polarizability of the interatomic bonds of the MOFs or COFs, the better the dielectric properties. Likewise, the dielectric properties are better, the lower the number of atoms per volume, whereby on the other hand on average the mechanical stability is impaired.

The invention is explained in more detail below based on an exemplary embodiment.

EXAMPLE 1

It shows:

FIG. 1 The arrangement of the atoms in the metallo-organic framework IRMOF-10

FIG. 1 shows the atomic structure of the metallo-organic framework IRMOF-10. The coordinates of the 166 atoms of the elementary cell are given in Table 1.

Table 1:

Coordinates of the atoms of IRMOF-10. Atom type, x, y, z coordinates as well as transformation matrix.

| | | | |
|---|---|---|---|
| C | 17.69545500 | 31.52594000 | 17.64974900 |
| C | 17.65012100 | 17.65330200 | 3.82251600 |
| C | 17.68594600 | 3.80991400 | 17.65938200 |
| C | 17.65899300 | 17.66272200 | 31.53854200 |
| C | 3.82249800 | 17.69872400 | 17.69584300 |
| C | 31.53852400 | 17.68905700 | 17.68559300 |
| O | 32.18758700 | 16.66136200 | 18.18911000 |
| O | 32.19274800 | 18.72468700 | 17.19541900 |
| O | 17.04497800 | 32.17148600 | 18.59328100 |
| O | 18.34957300 | 32.17146800 | 16.70818000 |
| O | 18.59389900 | 18.30374400 | 3.17728800 |
| O | 16.70839200 | 16.99962600 | 3.17677600 |
| O | 17.66837800 | 0.00825400 | 17.66836000 |
| O | 17.19619700 | 3.15569100 | 16.62350400 |
| O | 18.18914500 | 3.16101000 | 18.68727100 |
| O | 16.62325600 | 18.15298400 | 32.19257100 |
| O | 18.68661700 | 17.15934700 | 32.18774600 |
| O | 3.17689900 | 16.75487500 | 17.04580800 |
| O | 3.17712900 | 18.64045300 | 18.34985500 |
| Zn | 16.47421100 | 16.47901800 | 1.18434100 |
| Zn | 16.46673400 | 1.20790000 | 16.46654000 |
| Zn | 1.19556400 | 16.49004700 | 16.47437000 |
| Zn | 1.18405800 | 1.19996400 | 1.19529800 |
| C | 5.98969500 | 16.75332000 | 16.93237600 |
| C | 5.27866600 | 17.69865400 | 17.69273300 |
| C | 7.38055700 | 16.75989500 | 16.92475800 |
| C | 5.99116200 | 18.64469400 | 18.45158700 |
| C | 8.10432900 | 17.69861800 | 17.69071800 |
| C | 7.38165300 | 18.63778400 | 18.45666000 |
| C | 10.30234900 | 16.60814500 | 17.16288100 |
| C | 9.57861300 | 17.69808800 | 17.69105400 |
| C | 11.69333500 | 16.61196200 | 17.15400900 |
| C | 10.30174800 | 18.78826100 | 18.22087000 |
| C | 11.69231000 | 18.78463800 | 18.23142100 |
| C | 12.40604200 | 17.69845900 | 17.69294500 |
| H | 5.44004900 | 16.01298800 | 16.33879200 |
| H | 5.44162200 | 19.38442600 | 19.04534800 |
| H | 12.24167300 | 15.76320000 | 16.72732100 |
| H | 12.24064800 | 19.63258800 | 18.65927600 |
| H | 9.77366400 | 19.65839200 | 18.62594200 |
| H | 7.90924200 | 19.37283200 | 19.07465200 |
| H | 7.90759800 | 16.02543000 | 16.30556400 |
| H | 9.77467100 | 15.73720100 | 16.75825100 |
| C | 18.21282800 | 5.97857800 | 18.75439800 |
| C | 17.67679100 | 5.26680700 | 17.66547900 |
| C | 18.20233000 | 7.36944000 | 18.76081300 |
| C | 17.13619400 | 5.98126400 | 16.58112100 |
| C | 17.67424600 | 8.09390100 | 17.67087000 |
| C | 17.14460600 | 7.37195000 | 16.58000800 |
| C | 18.44144200 | 10.29241600 | 18.60833900 |
| C | 17.67507600 | 9.56837900 | 17.67067600 |
| C | 18.43642300 | 11.68308400 | 18.61229800 |
| C | 16.90917000 | 10.29093100 | 16.73159800 |
| C | 16.91634600 | 11.68144000 | 16.72231900 |
| C | 17.67801000 | 12.39383000 | 17.66519700 |
| H | 18.63930400 | 5.42937300 | 19.60261200 |
| H | 16.70961200 | 5.43329700 | 15.73237600 |
| H | 19.03136800 | 12.23301300 | 19.35162300 |
| H | 16.32193100 | 12.23025600 | 15.98195200 |
| H | 16.29052400 | 9.76272400 | 15.99697500 |
| H | 16.73965800 | 7.90056400 | 15.71035400 |
| H | 18.60681900 | 7.89632200 | 19.63191600 |
| H | 19.06070700 | 9.76532200 | 19.34335100 |
| C | 18.59529500 | 18.41583300 | 5.98992500 |
| C | 17.64994400 | 17.65572300 | 5.27866600 |
| C | 18.58852600 | 18.42322100 | 7.38078700 |
| C | 16.70392100 | 16.89662100 | 5.99093200 |
| C | 17.64964300 | 17.65736700 | 8.10432900 |
| C | 16.71061900 | 16.89131900 | 7.38144100 |
| C | 18.74001100 | 18.18564500 | 10.30219000 |
| C | 17.65001500 | 17.65724300 | 9.57863000 |
| C | 18.73642300 | 18.19457100 | 11.69317600 |
| C | 16.55991200 | 17.12765700 | 10.30188900 |
| C | 16.56373000 | 17.11715900 | 11.69248600 |
| C | 17.65010300 | 17.65551100 | 12.40600700 |
| H | 19.33573400 | 19.00941700 | 5.44045500 |

| | | | |
|---|---|---|---|
| H | 15.96427800 | 16.30286000 | 5.44123300 |
| H | 19.58522100 | 18.62140000 | 12.24130200 |
| H | 15.71581600 | 16.68948100 | 12.24100200 |
| H | 15.68962300 | 16.72269100 | 9.77396400 |
| H | 15.97564200 | 16.27323900 | 7.90897700 |
| H | 19.32306100 | 19.04230800 | 7.90786400 |
| H | 19.61081300 | 18.59040000 | 9.77438900 |
| C | 17.68523900 | 13.85089900 | 17.65876300 |
| C | 17.65005000 | 17.65264800 | 13.86335900 |
| C | 17.69557800 | 21.48497300 | 17.64976700 |
| C | 17.65846300 | 17.66300500 | 21.49746900 |
| C | 21.49748600 | 17.68987000 | 17.68516800 |
| C | 13.86335900 | 17.69888300 | 17.69557800 |
| O | 14.51544500 | 16.66553300 | 17.20307200 |
| O | 14.51487900 | 18.73052000 | 18.19262700 |
| O | 17.03997600 | 14.49833600 | 16.71109600 |
| O | 18.34207900 | 14.49425300 | 18.59798200 |
| O | 18.68363100 | 18.14497700 | 14.51532100 |
| O | 16.61860800 | 17.15551100 | 14.51502000 |
| O | 17.67005700 | 17.67845200 | 17.67007500 |
| O | 17.20321400 | 20.83297600 | 18.68327700 |
| O | 18.19264400 | 20.83334700 | 16.61821900 |
| O | 16.71079600 | 18.30833900 | 20.85006700 |
| O | 18.59764600 | 17.00614800 | 20.85409700 |
| O | 20.85404400 | 16.75072200 | 18.34206100 |
| O | 20.85012000 | 18.63755400 | 17.03985200 |
| Zn | 16.46371200 | 16.48216400 | 16.47726800 |
| Zn | 16.47709100 | 18.88477900 | 18.86622100 |
| Zn | 18.86307600 | 16.48522200 | 18.86311100 |
| Zn | 18.86627500 | 18.87111700 | 16.46351800 |
| C | 29.36717400 | 18.76728200 | 17.13619400 |
| C | 30.08164900 | 17.68287100 | 17.67661400 |
| C | 27.97648900 | 18.76836000 | 17.14478300 |
| C | 29.36996700 | 16.59395300 | 18.21277500 |
| C | 27.25455500 | 17.67744500 | 17.67438700 |
| C | 27.97910400 | 16.58757200 | 18.20241800 |
| C | 25.05759500 | 18.61671600 | 16.90917000 |
| C | 25.78007700 | 17.67767500 | 17.67514700 |
| C | 23.66706900 | 18.62610100 | 16.91625700 |
| C | 25.05591600 | 16.74001100 | 18.44142500 |
| C | 23.66524900 | 16.73612300 | 18.43633500 |
| C | 22.95457400 | 17.68327700 | 17.67794000 |
| H | 29.91507100 | 19.61604500 | 16.70959400 |
| H | 29.91222400 | 15.74573800 | 18.63916300 |
| H | 23.11832400 | 19.36648700 | 16.32178900 |
| H | 23.11523100 | 15.99679800 | 19.03119100 |
| H | 25.58292200 | 16.00491100 | 19.06068900 |
| H | 27.45225700 | 15.71650500 | 18.60697800 |
| H | 27.44792700 | 19.63806700 | 16.73997600 |
| H | 25.58583900 | 19.35125100 | 16.29047100 |
| C | 18.45162300 | 29.35740000 | 16.70376200 |
| C | 17.69262700 | 30.06980700 | 17.64978500 |
| C | 18.45681900 | 27.96690900 | 16.71061900 |
| C | 16.93244700 | 29.35869000 | 18.59517200 |
| C | 17.69087700 | 27.24411000 | 17.64976700 |
| C | 16.92500600 | 27.96781100 | 18.58854400 |
| C | 18.22079900 | 25.04660200 | 16.56008900 |
| C | 17.69112400 | 25.76980800 | 17.65019100 |
| C | 18.23126200 | 23.65598700 | 16.56374800 |
| C | 17.16279300 | 25.04612500 | 18.74013500 |
| C | 17.15383200 | 23.65512100 | 18.73638800 |
| C | 17.69280400 | 22.94234300 | 17.64999700 |
| H | 19.04534800 | 29.90701100 | 15.96403000 |
| H | 16.33888000 | 29.90823100 | 19.33562800 |
| H | 18.65901000 | 23.10756000 | 15.71578000 |
| H | 16.72703800 | 23.10687100 | 19.58516800 |
| H | 16.75810900 | 25.57382000 | 19.61104300 |
| H | 16.30590200 | 27.44080500 | 19.32306100 |
| H | 19.07482900 | 27.43937300 | 15.97564200 |
| H | 18.62594200 | 25.57456200 | 15.68990500 |
| C | 16.58103300 | 18.21217400 | 29.36712100 |
| C | 17.66537300 | 17.67164800 | 30.08163100 |
| C | 16.58000800 | 18.20365500 | 27.97645300 |
| C | 18.75432700 | 17.13552200 | 29.37002600 |
| C | 17.67095800 | 17.67406900 | 27.25457300 |
| C | 18.76077800 | 17.14596700 | 27.97914000 |
| C | 16.73172200 | 18.43926900 | 25.05756000 |
| C | 17.67079900 | 17.67332700 | 25.78007700 |
| C | 16.72224900 | 18.43202200 | 23.66703400 |
| C | 18.60842700 | 16.90701400 | 25.05595200 |
| C | 18.61224500 | 16.91194500 | 23.66526600 |
| C | 17.66502000 | 17.67025100 | 22.95457400 |
| H | 15.73227000 | 18.63877400 | 29.91501800 |
| H | 19.60252400 | 16.70908200 | 29.91927700 |
| H | 15.98184600 | 19.02643700 | 23.11828900 |
| H | 19.35149900 | 16.31701700 | 23.11528400 |
| H | 19.34363400 | 16.28790800 | 25.58297500 |
| H | 19.63188100 | 16.74142500 | 27.45234600 |
| H | 15.71035400 | 18.60849800 | 27.44783900 |
| H | 15.99724000 | 19.05807400 | 25.58578600 | transformation matrix

| | | |
|---|---|---|
| 0.000000 | 17.674087 | 17.674087 |
| 17.674087 | 0.000000 | 17.674087 |
| 17.674087 | 17.674087 | 0.000000 |

The properties of this IRMOF-10 are as follows:
Dielectric constant k=1.23
Mechanical compressive modulus B=6.00 GPa
Energy band gap $E_g$=3.07 eV.

EXAMPLES 2-6

The following metallo-organic frameworks show the properties listed in each case:

| | | | |
|---|---|---|---|
| IRMOF-1, FCC | k = 1.37 | B = 8.7 GPa | $E_g$ = 3.73 |
| IRMOF-1, SC | k = 1.39 | B = 6.33 GPa | $E_g$ = 3.66 |
| IRMOF-M11 | k = 1.45 | B = 12.00 GPa | $E_g$ = 4.91 |
| IRMOF-M13 | k = 1.50 | B = 9.00 GPa | $E_g$ = 5.49 |
| IRMOF-14 | k = 1.28 | B = 5.90 GPa | $E_g$ = 2.63 |

EXAMPLE 7

The covalent organic framework COF-108 shows the following properties: mass density: 0.17 g/cm$^3$ and specific surface (BET): 4210 m$^2$/g (H. M. El-Kalderi et al., Science 316 (2007) 268-272) and k=1.4.

The invention claimed is:

1. An integrated circuit comprising an insulation material, wherein the insulation material comprises
   an adhesive, and
   at least one MOF and/or at least one COF;
   wherein
   MOF means metallo-organic framework and
   COF means covalent organic framework.

2. The integrated circuit according to claim 1, wherein the insulation material consists essentially of one or more MOFs.

3. The integrated circuit according to claim 1, in which the adhesive is parylene.

4. The integrated circuit according to claim 1, in which the at least one MOF is present in a network in crystalline to random, free form.

5. The integrated circuit according to claim 1, in which the at least one MOF forms an IRMOF;
   wherein IRMOF means an isoreticular cubic network with analogous structural principle.

6. The integrated circuit according to claim 5, in which the IRMOF is selected from the group consisting of IRMOF-1 FCC, IRMOF-1 SC, IRMOF-10, IRMOF-M11, IRMOF-M13, and IRMOF-14.

7. The integrated circuit according to claim 1, in which a metal atom is present as central atom in the framework of the at least one MOF and/or at least one COF.

8. The integrated circuit according to claim 7, in which the metal atom is Cu or Zn.

9. A method of insulating integrated circuits, comprising applying an insulator material comprising adhesive and at least one MOF and/or at least one COF, wherein the insulator material has a dielectric constants of $k \leq 2$ to reduce a signal delay in the integrated circuit;
  wherein
    MOF means metallo-organic framework and
    COF means covalent organic framework.

10. The method of insulating integrated circuits according to claim 9, wherein the insulator material consists essentially of MOFs.

11. The method of insulating integrated circuits according to claim 9, wherein the insulator material further comprises an adhesive.

12. The method of insulating integrated circuits according to claim 11, in which the adhesive is parylene.

13. The method of insulating integrated circuits according to claim 9, wherein the insulation material comprises at least one MOF with a network in crystalline to random free form.

14. The method of insulating integrated circuits according to claim 9, wherein the insulator material comprises at least one IRMOF;
  wherein IRMOF means a MOF with an isoreticular cubic network with analogous structural principle.

15. The method of insulating integrated circuits according to claim 9, wherein the at least one MOF and/or at least one COF comprises a central metal atom in the framework.

16. The method of insulating integrated circuits according to claim 15, wherein the central metal atom is Cu or Zn.

* * * * *